United States Patent [19]

Mikata et al.

[11] Patent Number: 5,031,010

[45] Date of Patent: Jul. 9, 1991

[54] SEMICONDUCTOR MEMORY DEVICE AND METHOD OF MANUFACTURING THE SAME

[75] Inventors: Yuuichi Mikata; Toshiro Usami, both of Yokohama, Japan

[73] Assignee: Kabushiki Kaisha Toshiba, Kawasaki, Japan

[21] Appl. No.: 622,148

[22] Filed: Dec. 3, 1990

Related U.S. Application Data

[63] Continuation of Ser. No. 453,109, Dec. 22, 1989, abandoned, which is a continuation of Ser. No. 138,608, Dec. 29, 1987, abandoned.

[30] Foreign Application Priority Data

Jan. 7, 1987 [JP] Japan ..................... 62-593

[51] Int. Cl.$^5$ ............... H02L 29/68; H02L 29/06; H02L 29/34; H02L 29/04
[52] U.S. Cl. ................. 357/23.5; 357/23.9; 357/54; 357/59; 357/60
[58] Field of Search ............ 357/23.7, 23.5, 59 E, 357/23.3, 23.9, 23.14, 54, 59, 60; 365/185

[56] References Cited

U.S. PATENT DOCUMENTS

| | | |
|---|---|---|
| 4,203,158 | 5/1980 | Frohman-Bentchkowsky et al. .................. 357/23.5 |
| 4,396,933 | 8/1983 | Magda et al. ................ 357/54 |
| 4,458,407 | 7/1984 | Hoeg, Jr. et al. ............ 357/92 |
| 4,584,205 | 4/1986 | Chen et al. ................. 427/93 |
| 4,669,062 | 5/1987 | Nakano ..................... 357/23.7 |
| 4,680,609 | 7/1987 | Calder et al. ............... 357/23.7 |
| 4,812,898 | 3/1989 | Sumihiro ................... 357/23.5 |
| 4,868,629 | 9/1989 | Eitan ...................... 357/45 |
| 4,874,716 | 10/1989 | Rao ....................... 357/23.5 |
| 4,931,847 | 6/1990 | Corda ..................... 357/23.5 |

FOREIGN PATENT DOCUMENTS

| | | |
|---|---|---|
| 0164605 | 12/1985 | European Pat. Off. . |
| 47-11092 | 7/1972 | Japan .................... 357/23.9 |
| 51-18782 | 6/1976 | Japan . |
| 59-125665 | 1/1984 | Japan . |

OTHER PUBLICATIONS

R. M. Anderson et al., "Evidence for Surface asperity mechanism of conductivity in oxide grown on polycrystalline silicon", *Journal of Applied Physics*, vol. 48 (Sep. 1977) pp. 4834-4836.

J. Collinge et al., "Field-Effect in Large Grain Polysilicon Transistors," IEEE IEDM Conf. Proc. (1982), pp. 444-447.

*Primary Examiner*—J. Carroll
*Attorney, Agent, or Firm*—Finnegan, Henderson, Farabow, Garrett and Dunner

[57] ABSTRACT

In a semiconductor memory device having a floating gate structure, the floating gate electrode is composed of 2 to 10 silicon grains. With the floating gate electrode, the insulation film, formed on the floating gate electrode, can have a high breakdown voltage. In a method of manufacturing a semiconductor memory device having a floating gate structure, an insulation film is formed on the silicon substrate, portions of the insulation film which are on the drain and source forming regions of the silicon substrate are removed, and a silicon layer is formed on the silicon substrate by an epitaxial growth process, constituting a floating gate, composed of 2 to 10 silicon grains. According to the manufacturing method, the insulation film formed on the floating gate electrode can have a high breakdown voltage.

4 Claims, 6 Drawing Sheets

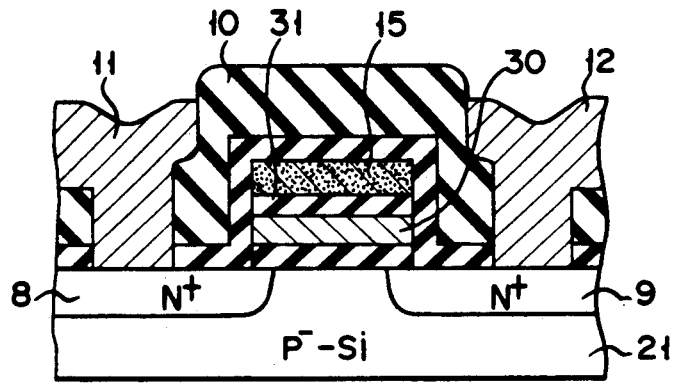
F I G. 3
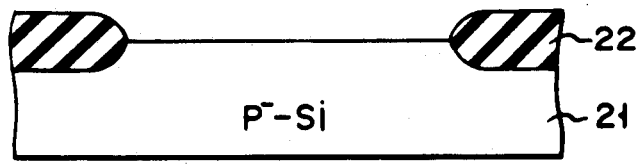
F I G. 4A
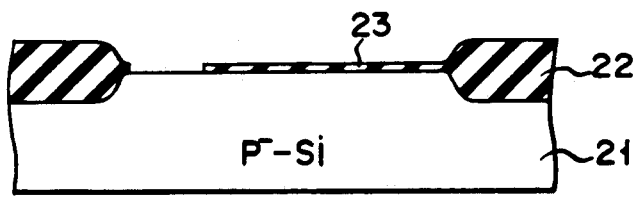
F I G. 4B
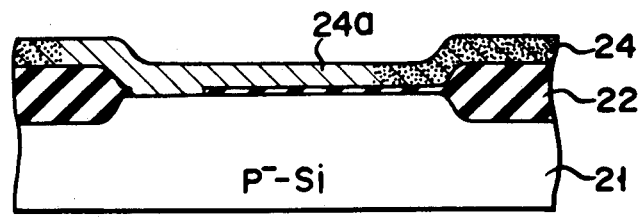
F I G. 4C

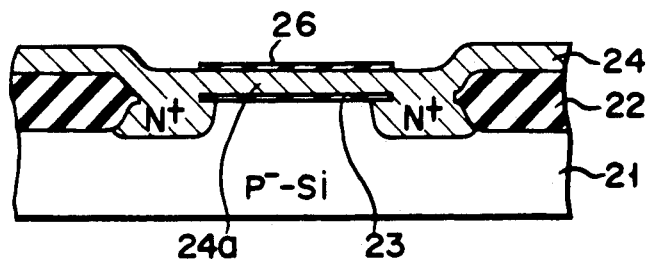
F I G. 8A
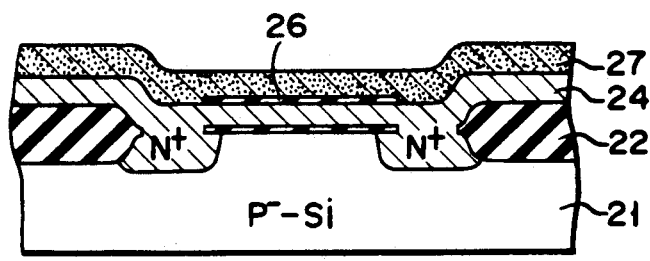
F I G. 8B
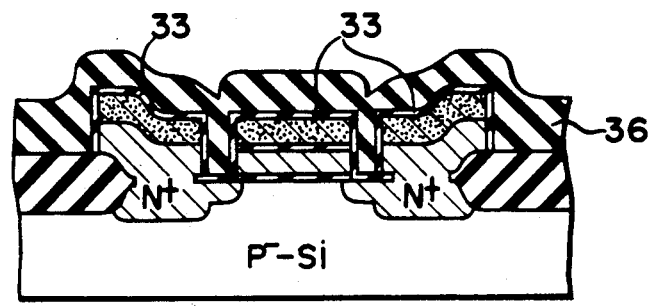
F I G. 8C
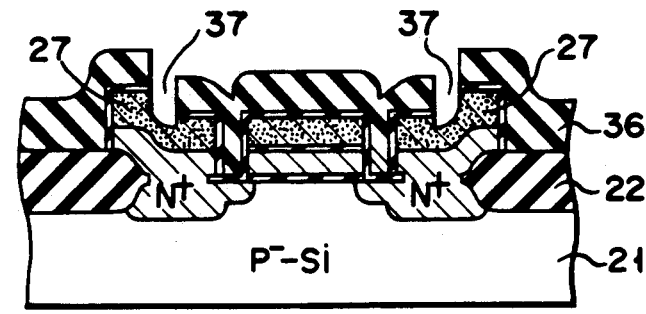
F I G. 8D

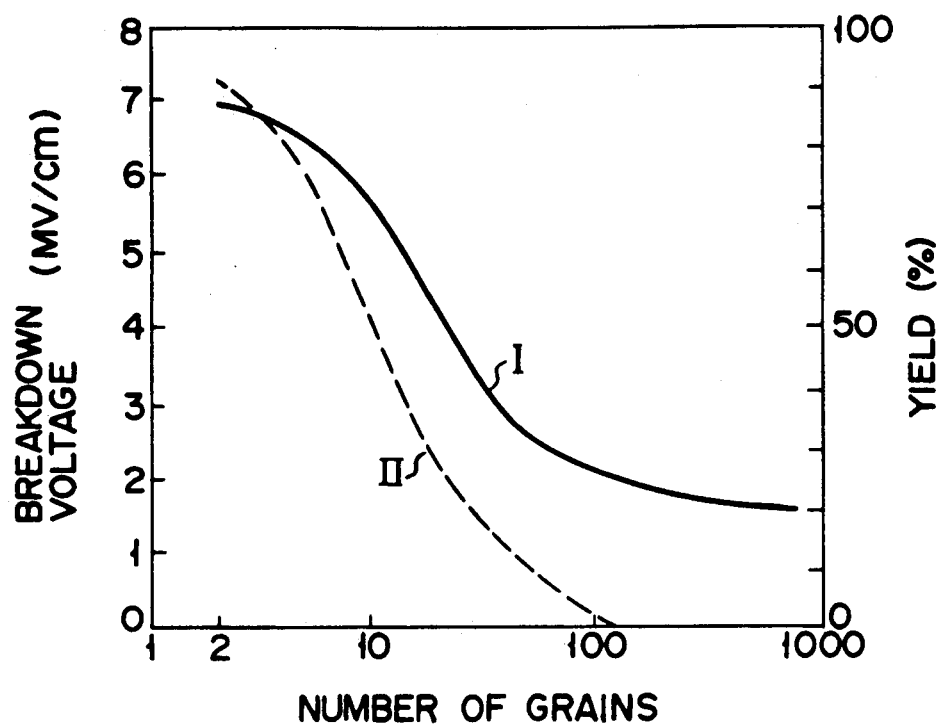
F I G. 5
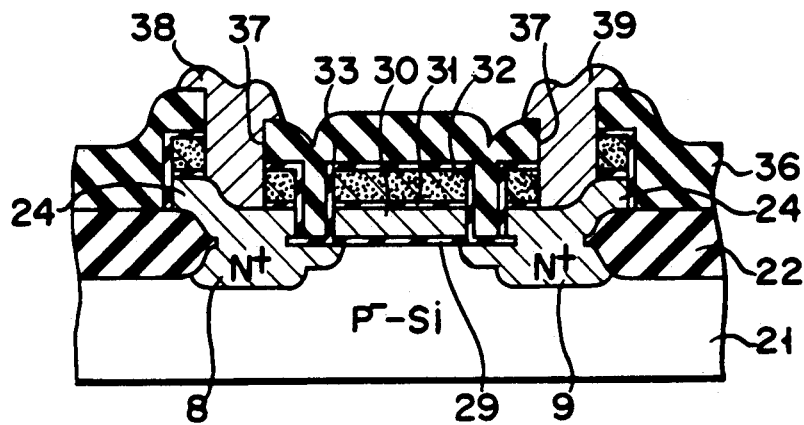
F I G. 6

SEMICONDUCTOR MEMORY DEVICE AND METHOD OF MANUFACTURING THE SAME

This application is a continuation of application Ser. No. 07/453,109 filed Dec. 22, 1989, now abandoned, which is a continuation of application Ser. No. 07/138,608 filed Dec. 29, 1987, now abandoned.

BACKGROUND OF THE INVENTION

The present invention relates to a semiconductor memory device having a floating gate structure and a method of manufacturing the same.

An EPROM (electrically programmable read only memory) shown in FIG. 1, for example, is known as a conventional semiconductor memory device having a floating gate structure. The EPROM shown in FIG. 1 is manufactured by the steps shown in FIGS. 2A to 2C.

As shown in FIG. 2A, first thermal oxide film 2 is formed on an island-like element region on $p^-$-type silicon substrate 1 surrounded by field oxide film 1a. First polysilicon film 3, which will be formed into a floating gate electrode, is formed on the entire surface of second thermal oxide film 2 using the CVD (chemical vapor deposition) method. Thereafter, a phosphorous is doped into first polysilicon film 3. Then, the resultant structure is thermally oxidized at a low temperature of, e.g., 1,000° C. or below to form second thermal oxide film 4 on first polysilicon film 3. Second polysilicon film 5, which will be formed into a control gate electrode, is formed on the entire surface of second gate thermal oxide film 4 using the CVD method. Then, a phosphorous is doped into second polysilicon film 5. Thereafter, as shown in FIG. 2B, photoresist film 6 having a predetermined pattern is formed on second polysilicon film 5. Films 5, 4, 3, and 2 are sequentially etched using photoresist film 6 as a mask to form first gate oxide film 12, floating gate electrode 13, second gate oxide film 14, and control gate electrode 15. An n-type impurity such as As ions is implanted in substrate 1 at a high concentration using this multilayer as a mask. Then, the resultant structure is thermally oxidized to form thermal oxide film 7 on the entire surface of the multilayer and exposed portions of substrate 1, as shown in FIG. 2C, while the implanted As ions are activated to form $n^+$-type drain and source regions 8 and 9. Thereafter, for example, PSG film 10 serving as a passivation film is formed on the entire surface of the resultant structure. PSG film 10 and thermal oxide film 7 are selectively etched to form contact holes (not shown) leading to drain and source regions 8 and 9, respectively. In addition, an Al-Si film (not shown) is formed on the entire surface of the resultant structure. The Al-Si film is patterned to form source electrode 11 (FIG. 1) and drain electrode 12 (both of which are not shown in FIG. 2C, but are respectively denoted by reference numbers 11 and 12 in FIG. 1). With the above process, the EPROM cell shown in FIG. 1 is manufactured.

In the above-described EPROM, electrons are injected into floating gate electrode 13 by applying a positive high voltage to $n^+$-type drain region 8 and control gate electrode 15, thereby writing data.

However, if a positive high voltage is applied for some reason to control gate electrode 15 after writing of data, the electrons injected into floating gate electrode 13 are attracted by control gate electrode 15 through the second thermal oxide film, and hence escape from floating gate electrode 13. For this reason, the data may not be retained.

Such an escape of electrons occurs because the breakdown voltage of second thermal oxide film 14 is low. The breakdown voltage is low for the following reason.

First polysilicon film 3 serving as the floating gate electrode is composed of grains having various crystal orientations. For this reason, if first polysilicon film 3 is thermally oxidized at a low temperature of 1,000° C. or below to form second thermal oxide film 4 serving as second thermal oxide film 14, surface asperity appears at the interface between floating gate electrode 13 and second gate oxide film 14, resulting in a decrease in breakdown voltage of second thermal oxide film 14. Such a problem caused by low-temperature thermal oxidation can be eliminated by thermally oxidizing second thermal oxide film 4 at a high temperature of 1,100° C. or higher instead of at low temperature. However, in high-temperature thermal oxidation, a predetermined junction position may be changed, or a wafer may be warped. As a result, the performance of the semiconductor memory device is degraded, and the yield is decreased.

SUMMARY OF THE INVENTION

The present invention has been made in consideration of the above situation, and has as its object to provide a semiconductor memory device, in which a second gate thermal oxide film can have a high breakdown voltage and an excellent memory retaining characteristic is obtained, and a method of manufacturing the same without decreasing the yield.

A semiconductor memory device according to the present invention is characterized in that a floating gate electrode of a memory cell is composed of 2 to 10, preferably 2 to 5 silicon grains. A method of manufacturing a semiconductor memory device according to the present invention is characterized in that a first insulation film is formed on an element region of a semiconductor substrate, portions of the first insulation film on drain and source forming regions of the substrate are removed to expose the drain and source forming regions, and a polysilicon layer is formed on the entire surface of the structure in this state by the CVD method, so that 2 to 10, preferably 2 to 5 silicon grains are formed on a portion of the polysilicon layer, which serves as a floating gate electrode.

According to the method described above, the floating gate electrode is composed of a small number of grains. Therefore, even if the second insulation film is formed by low-temperature thermal oxidation, surface asperity at the interface of the second insulation film and the polysilicon layer composed of a small number of grains can be minimized. Hence, the breakdown voltage of the second insulation film can be increased. Especially, if the polysilicon layer is composed of 2 to 5 grains, the state of surface asperity becomes substantially equivalent to that of a single crystal, and hence is significantly reduced.

In the present invention, the number of grains was measured by a transmission electron micrograph.

According to the present invention, there is provided a semiconductor memory device comprising:
 a silicon substrate; and
 a silicon layer constituting a floating gate electrode composed of 2 to 10 silicon grains.

According to the present invention, there is further provided a semiconductor memory device having a floating gate structure, comprising:
- a silicon substrate having a drain region and a source region;
- a floating gate electrode formed of a polysilicon layer composed of 2 to 10 polysilicon grains;
- a first insulation film formed on said floating gate electrode;
- a control gate electrode formed of a polysilicon layer formed on said first insulation film;
- a second insulation film formed on the structure, and having contact holes leading to at least one of said drain region and source region; and
- electrode layers extending in said contact holes formed in said second insulation film, and contacting said at least one of the drain region and source region.

According to the present invention, there is still further provided a semiconductor memory device with a floating gate structure, comprising:
- a silicon substrate having a drain region and a source region formed therein;
- a first polysilicon layer composed of 2 to 10 polysilicon grains, forming a floating gate electrode;
- second polysilicon layers formed on at least one of said drain region and source region;
- a first insulation film formed on said floating gate electrode;
- a third polysilicon layer formed on said first insulation film, forming a control gate electrode;
- fourth polysilicon layers formed on said second polysilicon layers;
- a second insulation film formed on the structure, and having contact holes formed therein leading to said fourth polysilicon layers; and
- electrode layers extending in said contact holes formed in said second insulation film, and contacting said second polysilicon layers.

According to the present invention, there is further provided a method of manufacturing a semiconductor memory device comprising the steps of:
- forming an insulation film on a silicon substrate;
- removing a predetermined portion of said insulation film;
- forming a silicon layer on said silicon substrate by an epitaxial growth process, said silicon layer having a portion which extends on said insulation film and composes 2 to 10 silicon grains; and
- removing a predetermined portion of said silicon layer to form a portion thereof which is separated from said substrate.

According to the present invention, there is still further provided a method of manufacturing a semiconductor memory device having a floating gate structure, comprising the steps of:
- forming a first insulation film on a silicon substrate;
- removing that portion of said insulation film, which is at least one of the drain and source forming regions of said silicon substrate to form a gate insulation film;
- forming a first polysilicon layer composed of 2 to 10 silicon grains on said silicon substrate by an epitaxial growth process;
- forming a second insulation film on said first polysilicon layer;
- forming a second polysilicon layer on said second insulation film;
- removing the predetermined portions of said first polysilicon layer, first insulation film, and second polysilicon layer, so that a portion thereof remains which is on said gate insulation film, and said at least one of the drain and source forming regions is exposed;
- doping impurities into said drain and source forming regions to form a source and drain;
- forming a third insulation film on the structure, having contact holes formed therein leading to at least one of said drain and source; and
- forming electrodes extending in said contact holes formed in said third insulation film and contacting said at least one of the drain and source.

According to the present invention, there is yet further provided a method of manufacturing a semiconductor memory device having a floating gate structure, comprising the steps of:
- forming a first insulation film on a silicon substrate;
- removing that portion of said insulation film, which is on at least one of the drain and source forming regions of said silicon substrate to form a gate insulation film;
- doping impurities into said drain and source forming regions to form a source and drain;
- forming a first polysilicon layer composed of 2 to 10 silicon grains on said silicon substrate by an epitaxial growth process;
- forming a second insulation film on said first polysilicon layer;
- forming a second polysilicon layer on said second insulation film;
- removing the predetermined portions of said first polysilicon layer, first insulation film, and second polysilicon layer, so that those portions thereof remain, which are on said gate insulation film and at least one of said drain and source;
- forming a third insulation film on the structure;
- forming contact holes in said third insulation film, second insulation film, and second polysilicon layer, leading to said portions of said second polysilicon layer remaining on said at least one of the source and drain; and
- forming electrodes extending in said contact holes and contacting at least one of said portions of said second semiconductor layer remaining on said at least one of the source and drain.

BRIEF DESCRIPTION OF THE DRAWINGS

FIG. 3 is a sectional view of an EPROM cell according to an embodiment of the present invention;

FIGS. 4A to 4G are sectional views of a structure of the EPROM cell shown in FIG. 3 in each manufacturing step;

FIG. 5 shows characteristic curves of the semiconductor memory device shown in FIGS. 3 and 4A to 4G;

FIG. 6 is a sectional view of an EPROM according to another embodiment of the present invention;

FIGS. 8A to 8D are sectional views of a structure of a modification of the EPROM cell shown in FIG. 6 in each manufacturing step.

DETAILED DESCRIPTION OF THE PREFERRED EMBODIMENTS

An EPROM according to an embodiment of the present invention will be described below with reference to the accompanying drawings.

Figure 1:
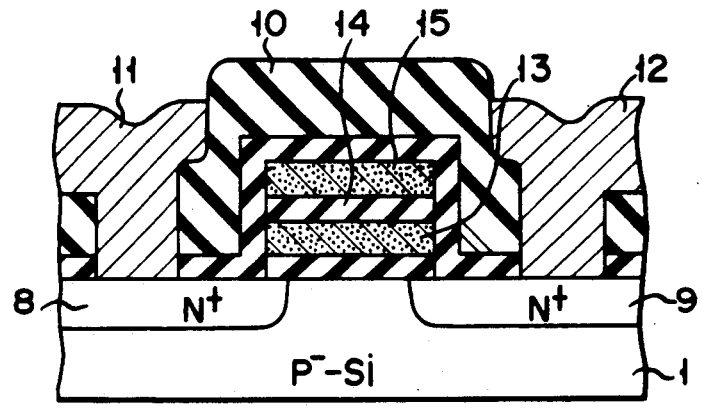
FIG. 1 is a sectional view of a conventional EPROM cell.
Figure 2A:
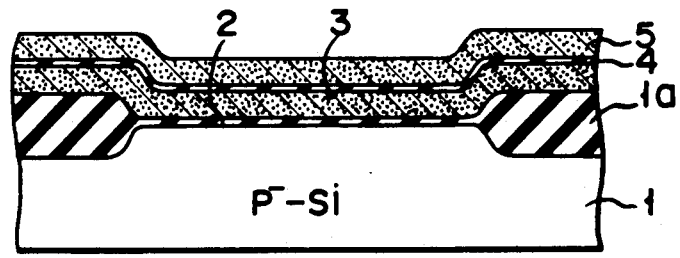
FIGS. 2A to 2C are sectional views of a structure of the conventional EPROM cell shown in FIG. 1 in each manufacturing step.
Figure 2B:
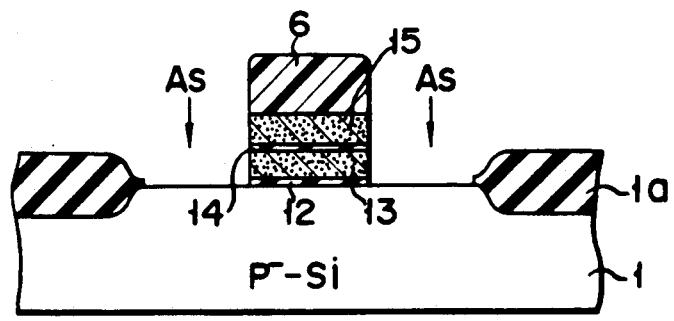
Figure 2C:
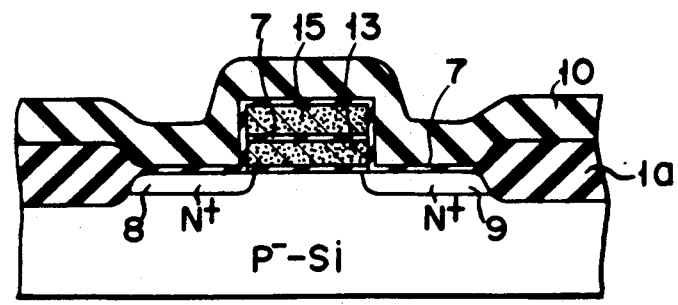

The same reference numerals in FIG. 3 denote the same parts as in FIG. 1. In the conventional device shown in FIG. 1, floating gate electrode 13 is formed of polysilicon, whereas in the embodiment shown in FIG. 3, floating gate electrode 30 is formed of 2 to 10 silicon grains. This is a characteristic feature of the present invention.

A method of manufacturing a memory device according to the embodiment (FIG. 3) will now be described with reference to FIGS. 4A to 4G.

Field oxide film 22 having a thickness of about 1.2 $\mu$m is formed on p$^-$-type silicon substrate 21 having a resistivity of about 10 to 20 $\Omega$-cm using a normal selective oxidation technique (FIG. 4A). A first insulation film, i.e., first thermal oxide film 23 having a thickness of 500 Å is formed on an island-like element region of substrate 21, surrounded by field oxide film 22. Then, a portion of film 23, on a drain forming region of substrate 21, is etched using NH$_4$F gas to expose the drain forming region of substrate 21 (FIG. 4B).

Subsequently, 1,000-Å thick first polysilicon film 24, which is later formed into a floating gate electrode, is then formed on the entire surface of the resultant structure, using the CVD method. Film 24 is formed on the substrate at a substrate temperature of about 1,050° C. and a total SiH$_2$Cl$_2$ pressure of 3.9 $\times$ 10$^{-3}$ Torr. The partial pressure of HCl is about 7 $\times$ 10$^{-3}$ Torr. and the partial pressure of H$_2$ is about 2.0 $\times$ 10$^{-2}$ Torr. In this case, the number of grains in floating gate electrode portion 24a of first polysilicon film 24, grown from the exposed substrate region, i.e., the drain forming region, would be 2 to 5 (FIG. 4C). The number of grains is measured by a transmission electron micrograph.

Figure 4D:
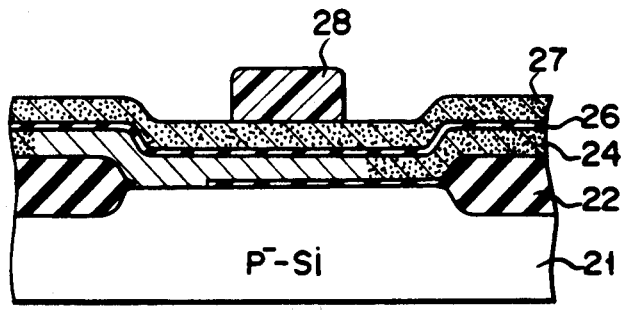

Subsequently, phosphorus is doped into first polysilicon film 24 by thermal diffusion. The resultant structure is thermally oxidized at a temperature of 900° C. to form 500-Å thick second thermal oxide film 26 on first polysilicon film 24. Second polysilicon film 27, which is later formed into a control gate electrode, having a thickness of about 3,500 Å and a sheet resistance of about 20 $\Omega$, is formed on the entire surface of the resultant structure, using the CVD method. Thereafter, photoresist film 28 is formed on a portion of second polysilicon film 27, which corresponds to a channel region (FIG. 4D).

Figure 4E:
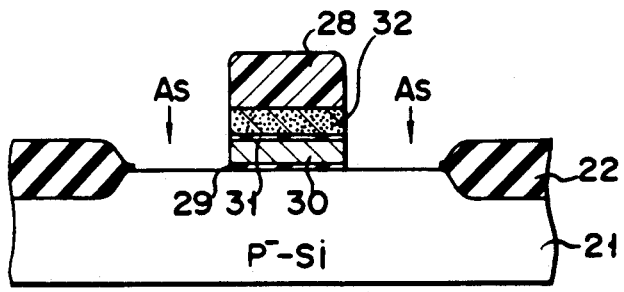

Then, second polysilicon film 27, second thermal oxide film 26, first polysilicon film 24, and first thermal oxide film 23 are sequentially etched using photoresist film 28 as a mask to form first gate thermal oxide film (gate insulation film) 29, floating gate electrode 30, second gate thermal oxide film 31, and control gate electrode 32. Following this, As ions were implanted in substrate 21 at an acceleration energy of about 60 KeV and at a dose of about 2.5 $\times$ 10$^{15}$/cm$^2$ using this multilayer as a mask (FIG. 4E).

Figure 4F:
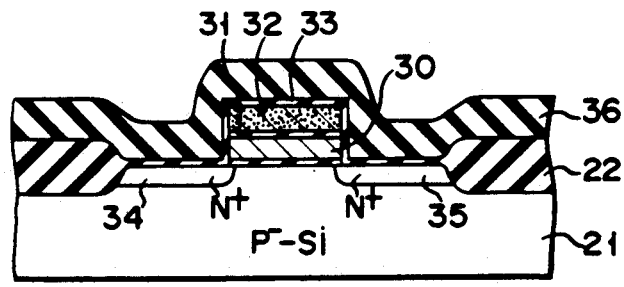

Thereafter, photoresist film 28 is removed, and the resultant structure is thermally oxidized at a temperature of about 1,000° C. to form thermal oxide film 33 having a thickness of about 500 Å on the entire surface. The implanted As ions are activated during the thermal oxidation to form n$^+$-type drain and source regions 34 and 35, each having a sheet resistance of about 30 to 40 $\Omega$ and a depth of about 0.4 $\mu$m. Then, PSG film 36 having a thickness of about 0.8 $\mu$m and serving as a passivation film, is formed on the entire surface of the resultant structure, using the CVD method (FIG. 4F).

Figure 4G:
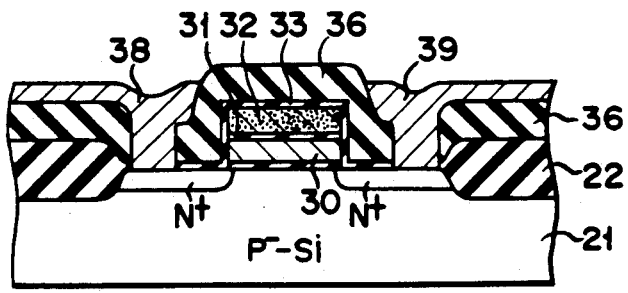

Subsequently, PSG film 36 and thermal oxide film 33 are selectively etched to form contact holes leading to drain and source regions 34 and 35, respectively. Al-Si film having a thickness of about 1.0 $\mu$m was formed on the entire surface of the resultant structure using the CVD method. Then, the Al-Si film is patterned to form drain and source electrodes 38 and 39 (FIG. 4G). The EPROM shown in FIG. 3 can be manufactured with the above process.

According to the manufacturing method of the embodiment, since first polysilicon film 24 is composed of a small number of grains and is formed in the step of FIG. 4C, even if the resultant structure is thermally oxidized at a low temperature of about 900° C. to form second thermal oxide film 26 on polysilicon film 24, the surface asperity at the interface of second thermal oxide film 26 and floating gate electrode portion 24a of first polysilicon film 24 is greatly reduced. As a result, second gate thermal oxide film 31 provides a high voltage. Therefore, even if a positive high voltage is accidentally applied to control gate electrode 32 of the EPROM shown in FIG. 4G, the electrons injected into floating gate portion 24 are not attracted by control gate electrode 32 and can not escape from floating gate portion 24, thereby retaining written data.

According to the above method, because second thermal oxide film 26 is formed by a low-temperature oxidation, substrate 21 is not warped. Therefore, the yield of semiconductor memory devices increases.

FIG. 5 shows characteristic curves of the semiconductor memory device shown in FIGS. 3 and 4A to 4G. Characteristic curve I represents the relationship between the number of grains and the breakdown voltage (MV/cm). Characteristic curve II denotes the relationship between the number of grains and the yield of the device (%). In FIG. 5, the value of the number of grains is logarithmic. As shown in FIG. 5, when the number of grains is between 2 and 10, the breakdown voltage is higher than 5.8 (MV/cm) and the yield of the device is more than 50 (%). When the number of grains is more than 10, the breakdown voltage and the yield of the device are greatly reduced.

FIG. 6 shows an EPROM according to another embodiment of the present invention. In this embodiment, phosphorus-doped first polysilicon films 24 of a low resistance are left on drain and source regions 8 and 9. The surface area of each polysilicon film 24 thus left is larger than that of corresponding drain or source region 8 or 9, thereby increasing the masking margin for forming contact holes 37 for leading drain and source electrodes 38 and 39 to drain and source regions 8 and 9, respectively. As a result, the yield is improved.

A method for manufacturing the EPROM shown in FIG. 6 will now be described with reference to FIGS. 7A to 7D. According to the method of this embodiment, after first thermal oxide film 23 was formed on the entire surface and before first polysilicon film 24 was formed, the portions of first thermal oxide film 23, which corresponded to drain and source regions 8 and 9, were removed.

The same contents as described with reference to FIGS. 4A and 4G will now be simply explained by referring to the same figures.

Figure 7A:
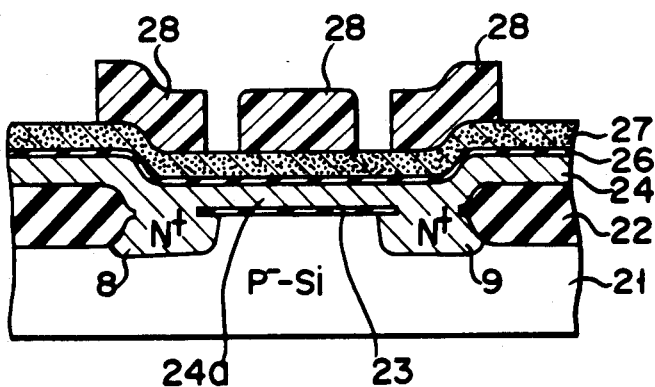
FIGS. 7A to 7D are sectional views of a structure of the EPROM cell shown in FIG. 6 in each manufacturing step.

As is shown in FIGS. 4A and 4B, field oxide film 22 and first thermal oxide film 23 were formed. Thereafter, portions of first thermal oxide film 23, on the forming regions of drain and source regions 8 and 9 of substrate 21, are removed, exposing the forming regions (FIG. 7A). First polysilicon layer 24 was formed on the entire surface of the resultant structure by the CVD method using a doping gas containing phosphorus. In this case, floating gate electrode portion 24a of first polysilicon layer 24, grown from the exposed substrate region (the drain and source forming regions), was a silicon layer composed of a small number of grains. When first polysilicon layer 24 was grown, n+-type drain and source regions 8 and 9 were respectively formed in the drain and source forming regions by phosphorus in the doping gas.

Figure 7B:
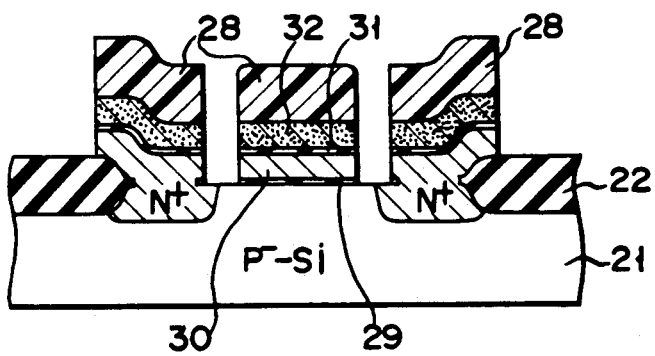

Next the same step as shown in FIG. 4D was performed. More specifically, second thermal oxide film 26 was formed on first polysilicon film 24, and second polysilicon film 27 was formed on the resultant structure. Photoresist film 28 having a predetermined pattern was formed on film 27. Then, films 27, 26, 24, and 23 were selectively etched, using photoresist film 28 as a mask in the same manner as in the step of FIG. 4E, to form predetermined multilayers on drain and source regions 8 and 9, and a channel region. Upon etching, first polysilicon film 24 was divided into portions: a portion on drain region 8, a portion on source region 9, and a portion acting as floating gate electrode 24a. Photoresist film 28 was left on the portions of first polysilicon film 24 and second polysilicon film 27 on drain and source regions 8 and 9 so as to retain these portions (FIG. 7B).

Figure 7C:
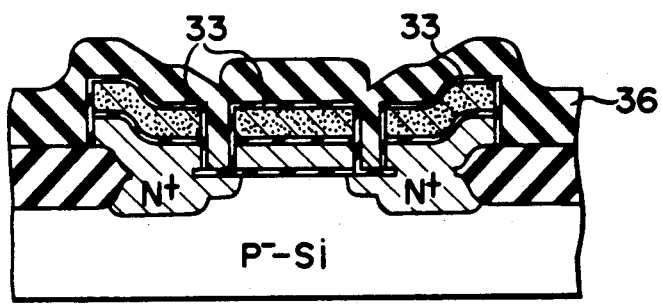
Figure 7D:
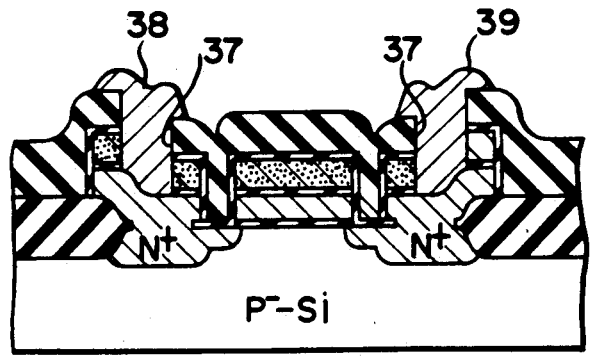

Subsequently, thermal oxide film 33 was formed on the entire surface. PSG film 36 was formed on the resultant structure (FIG. 7C). Contact holes 37, leading to drain and source regions 8 and 9, were formed in the same manner as in the step of FIG. 4G. Drain and source electrodes 38 and 39 were formed in contact holes 37, thereby completing the memory cell shown in FIG. 6 (FIG. 7D).

As shown in FIG. 8A, the portions of second thermal oxide film 26, on the source and drain forming regions, were removed before second polysilicon film 27 was formed. Thereafter, as shown in FIG. 8B, second polysilicon film 27 was formed. In this case, thermal oxide film 33 and PSG film 36 were sequentially formed over the entire surface, as shown in FIG. 8C. Then, contact holes 37 were formed in first polysilicon film 27, as shown in FIG. 8D. Since it suffices that contact holes 37 were formed in second polysilicon film 27 in a shallow depth, the diameter of each contact hole 37 therefore decreased. As a result, the masking margin for forming contact holes 37, was further increased, as was the yield.

In the embodiments shown in FIGS. 6, 7A to 7D and 8A to 8D, the characteristic curves are substantially the same as those of which were obtained in FIG. 5.

Note that even if the manufacturing methods, described with reference to FIGS. 7A to 7D, and 8A to 8D, are applied to the formation of only one of the source and drain, the masking margin for forming a contact hole is increased.

In the first and second embodiments, the polysilicon films composed of a small number of grains were formed by the CVD method. However, the same effects as in the above embodiments can be anticipated when a floating gate electrode is composed of 10 grains or less by other methods.

According to the present invention, a first insulation film was formed, and then drain and source forming regions in a substrate were exposed. In this state, a polysilicon layer was formed on the entire surface by the CVD method. In this case, a floating gate electrode, grown from the exposed substrate regions, was composed of a small number of grains. As a result, the breakdown voltage of a second insulation film formed on the floating gate electrode, composed of a small number of grains, was significantly improved as compared with that of the second gate insulation film formed on the conventional polysilicon film. Therefore, the electrons that were injected into the floating gate electrode during the write operation, did not leak from the floating gate electrode, even when a high positive voltage was applied to the control gate electrode, and hence the device according to the present invention, exhibited excellent memory retaining characteristics. In addition, the second insulation film was formed on the silicon layer, composing a small number of grains. Therefore, even if it was formed by low-temperature oxidation, the second insulation film could have a sufficiently high breakdown voltage, and the yield of the semiconductor device would be increased.

What is claimed is:

1. A nonvolatile semiconductor memory device with a floating gate structure, comprising:
   a silicon substrate;
   a floating gate electrode composed of 2 to 10 silicon grains for limiting a number of asperities therein, said floating gate electrode having a potential; and
   a control electrode for controlling the potential of said floating gate electrode.

2. A nonvolatile semiconductor memory device having a floating gate structure, comprising:
   a silicon substrate having a drain region and a source region;
   a floating gate electrode composed of 2 to 10 polysilicon grains for limiting a number of asperities therein, said floating gate electrode having a potential;
   a first insulation film formed on said floating gate electrode;
   a control gate electrode comprising a polysilicon layer formed on said first insulation film, for controlling the potential of said floating gate electrode;
   a second insulation film formed on the structure, and having contact holes leading to at least one of said drain region and source region; and
   electrode layers extending in said contact holes formed in said second insulation film, and contacting at least one of said drain region and source region.

3. A nonvolatile semiconductor memory device with a floating gate structure, comprising:
   a silicon substrate having a drain region and a source region formed therein;
   a first polysilicon layer a having floating gate electrode composed of 2 to 10 polysilicon grains for limiting a number of asperities therein, said floating gate electrode having a potential;
   second polysilicon layers formed on at least one of said drain region and source region;

a first insulation film formed on said floating gate electrode;

a third polysilicon layer formed on said first insulation film, forming a control gate electrode for controlling the potential of said floating gate electrode;

fourth polysilicon layers formed on said second polysilicon layers;

a second insulation film formed on the structure, and having contact holes formed therein leading to said fourth polysilicon layers; and electrode layers extending in said contact holes formed in said second insulation film, and contacting said second polysilicon layers.

4. A semiconductor memory device according to claim 3, wherein said fourth polysilicon layers comprise contact holes formed therein and continuous to said contact holes formed in said second insulation film, and wherein said semiconductor memory device further comprises third insulation films formed between said second polysilicon layers and said fourth polysilicon layers, said third insulation films having contact holes formed therein and continuous to said contact holes formed in said fourth polysilicon layers and said second insulation film.

* * * * *